(12) United States Patent
Lu et al.

(10) Patent No.: US 10,346,347 B2
(45) Date of Patent: Jul. 9, 2019

(54) FIELD-PROGRAMMABLE CROSSBAR ARRAY FOR RECONFIGURABLE COMPUTING

(71) Applicant: THE REGENTS OF THE UNIVERSITY OF MICHIGAN, Ann Arbor, MI (US)

(72) Inventors: Wei Lu, Ann Arbor, MI (US); Mohammed A. Zidan, Ann Arbor, MI (US)

(*) Notice: Subject to any disclaimer, the term of this patent is extended or adjusted under 35 U.S.C. 154(b) by 9 days.

(21) Appl. No.: 15/723,668

(22) Filed: Oct. 3, 2017

(65) Prior Publication Data

US 2018/0095930 A1      Apr. 5, 2018

Related U.S. Application Data

(60) Provisional application No. 62/403,372, filed on Oct. 3, 2016.

(51) Int. Cl.
| | | |
|---|---|---|
| *G11C 11/00* | (2006.01) | |
| *G06F 15/78* | (2006.01) | |
| *G11C 13/00* | (2006.01) | |
| *H03K 19/177* | (2006.01) | |
| *G11C 7/10* | (2006.01) | |

(52) U.S. Cl.
CPC ........ *G06F 15/7867* (2013.01); *G11C 7/1006* (2013.01); *G11C 13/0002* (2013.01); *H03K 19/177* (2013.01); *G11C 2213/70* (2013.01); *G11C 2213/77* (2013.01); *Y02D 10/12* (2018.01); *Y02D 10/13* (2018.01)

(58) Field of Classification Search
CPC .................. G11C 13/0069; G11C 13/0004

USPC ........................................................ 365/148
See application file for complete search history.

(56) References Cited

U.S. PATENT DOCUMENTS

| | | |
|---|---|---|
| 5,559,970 A | 9/1996 | Sharma |
| 6,759,869 B1 | 7/2004 | Young et al. |
| 7,554,355 B2 | 6/2009 | Chang et al. |
| 7,564,262 B2 | 7/2009 | Mouttet |

(Continued)

OTHER PUBLICATIONS

M. Hu et al "Memristor Crossbar Neuromorphic Computing System: A Case Study", IEEE Transactions on Neural Networks and Lewarning Systems 25, 10 (2014).

(Continued)

*Primary Examiner* — Huan Hoang
*Assistant Examiner* — Minh Dinh

(57) ABSTRACT

For decades, advances in electronics were directly related to the scaling of CMOS transistors according to Moore's law. However, both the CMOS scaling and the classical computer architecture are approaching fundamental and practical limits. A novel memory-centric, reconfigurable, general purpose computing platform is proposed to handle the explosive amount of data in a fast and energy-efficient manner. The proposed computing architecture is based on a single physical resistive memory-centric fabric that can be optimally reconfigured and utilized to perform different computing and data storage tasks in a massively parallel approach. The system can be tailored to achieve maximal energy efficiency based on the data flow by dynamically allocating the basic computing fabric to storage, arithmetic, and analog computing including neuromorphic computing tasks.

16 Claims, 14 Drawing Sheets

(56) References Cited

U.S. PATENT DOCUMENTS

| | | | |
|---|---|---|---|
| 7,609,086 | B2 | 10/2009 | Mouttet |
| 8,082,526 | B2 | 12/2011 | Hutton et al. |
| 9,852,790 | B1* | 12/2017 | Gokmen ............ G11C 13/0007 |
| 2007/0126474 | A1 | 6/2007 | Chang et al. |
| 2010/0054072 | A1* | 3/2010 | Stansfield ................ G11C 8/14 |
| | | | 365/230.03 |
| 2012/0254541 | A1* | 10/2012 | Beckmann .......... G06F 12/0802 |
| | | | 711/122 |
| 2017/0243642 | A1* | 8/2017 | Muralimanohar .......................... |
| | | | G11C 13/0023 |
| 2018/0197917 | A1* | 7/2018 | Ando .................. H01L 27/2463 |

OTHER PUBLICATIONS

Sharad, et al "Ultra Low Power Associative Computing With Spin Neurons and Resistive Crossbar Memory" Proceedings of the 50th Annual Design Automation Conference. ACM (2013).
B. Chen et al "Efficient In-Memory Computing Architecture Based on Crossbar Arrays", IEEE (2015).
S. H. Jo et al "Nano-scale Memristor Device As Synapse in Neuromorphic Systems" Nano Lett. 10, (2010).
K. Kim "A Functional Memristor Crossbar-Array/CMOS System for Data Storage and Neuromorphic Applications", Nano Lett. (2012).

* cited by examiner

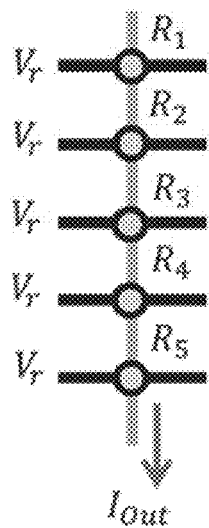 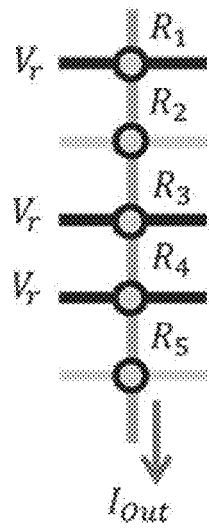 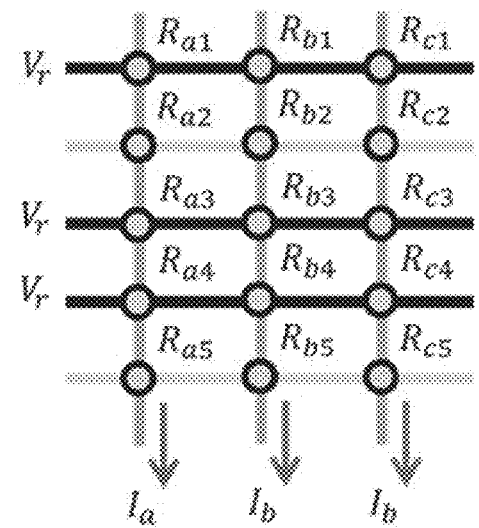
FIG. 4A     FIG. 4B     FIG. 4C
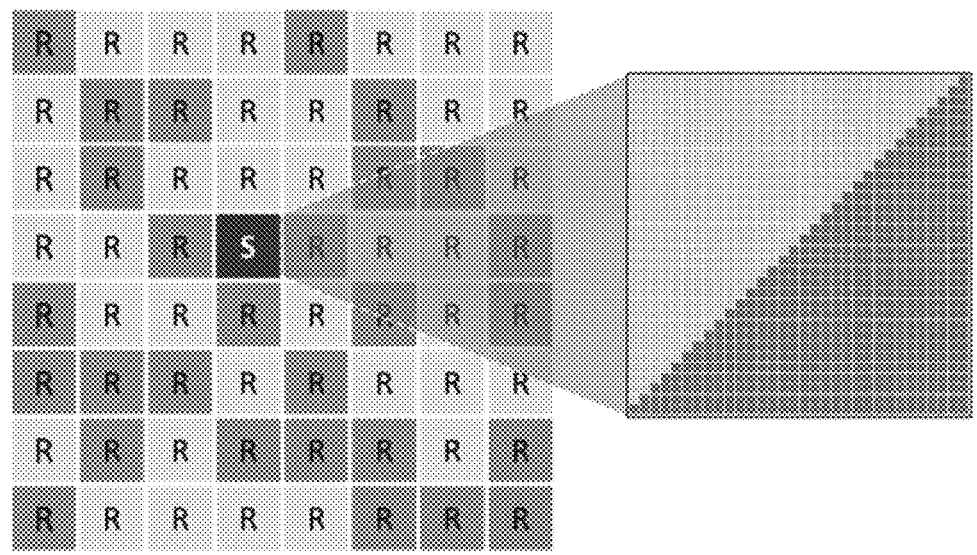
FIG. 5

FIG. 15

FIELD-PROGRAMMABLE CROSSBAR ARRAY FOR RECONFIGURABLE COMPUTING

CROSS-REFERENCE TO RELATED APPLICATIONS

This application claims the benefit of U.S. Provisional Application No. 62/403,372 filed on Oct. 3, 2016. The entire disclosure of the above application is incorporated herein by reference.

GOVERNMENT CLAUSE

This invention was made with government support under Grant No. FA9550-12-1-0038 awarded by the United States Air Force/Air Force Office of Scientific Research. The Government has certain rights in this invention.

FIELD

The present disclosure relates to field-programmable crossbar array for reconfigurable computing.

BACKGROUND

The development of ever more powerful computing systems has for decades driven the most rapid technology advance in the human history. Currently, billions of digital microprocessors facilitate our daily life and empower our anticipations for a better future on earth. However, modern demands such as big data analysis, artificial intelligence, or energy efficient computing cannot be capably fulfilled with the current aging computing technology. For more than forty years, improvement in computer performance was derived by scaling down of CMOS transistors. This performance improvement slowed down after hitting the heat and memory walls, and approaching its physical scaling limits by the mid of 2020's. Therefore, there is an imperative need to shift to new technologies, at both the architecture and the device levels. Recently, resistive memory, based on the concept of memristors, have attracted attention for being a promising candidate for future computing needs due to their fast operating speed, low power, high endurance, and very high density.

Along its history, digital computers passed through four different generations, namely, Cathode Ray Tubes (CRTs), transistors, Integrated Circuit (ICs) and microprocessors. Here it is clearly noted that technology advance at the device level always marked the transition from each generation to the other. We believe that the recent development in resistive memory devices is the key for the fifth computer generation. For instance, the high-density memristor crossbar structure is wildly considered as a promising candidate for nonvolatile storage and Random Access Memory (RAM) systems. Furthermore, analog resistive devices have been shown to be well suited for bio-inspired analog computing systems and can significantly outperforms classical digital computing in many "soft" computing applications where the task is complex but approximate solutions are tolerated such as data classification, recognition, and analysis. At the other end of the spectrum, many trials have also been presented in the literature to perform accurate digital computations using binary resistive memory devices. In these cases, systems based on these emerging devices are normally studied as accelerators for a subset of specialized tasks, e.g. data storage, neuromorphic computing, and arithmetic analysis, and each task uses different physical device properties, circuits, and system organization to achieve the specialized goals. While utilizing these subsystems in a traditional computing platform is expected to achieve improved performance, particularly for the targeted tasks, a general computing system that can handle different tasks in a changing environment in fast and energy-efficient manner still remain to be desired.

In this disclosure, a common physical block that can store data and process it in-place in an analog or digital fashion is presented. Utilizing binary resistive crossbar, crossbar-based binary neural networks, arithmetic tree reduction, and in-situ data migration are presented. This enables the proposed field programmable crossbar array (FPCA) computing system to achieve three outstanding features using the same physical system, without hardware reconfigurations. Firstly, the ability to process any arbitrary workload in its optimal computing domain (Digital or Analog). Secondly, the natively modular design of the system allows a high degree of scalability and the ability to tailor fit different workload. Finally, it merges processing and memory together at the lowest physical level to achieve maximal efficiency and minimal data migration. Such a combination enables high-performance computing for different tasks with a much smaller energy budget compared to classical Von Neumann architectures to perform natively scalable, reconfigurable (i.e. software-defined) and energy-efficient computing.

This section provides background information related to the present disclosure which is not necessarily prior art.

SUMMARY

This section provides a general summary of the disclosure, and is not a comprehensive disclosure of its full scope or all of its features.

A field-programmable crossbar array is presented for reconfigurable computing. The crossbar array includes a plurality of crossbar modules interconnected together. Each crossbar module is comprised of at least one interface circuit and an array of resistive memory devices arranged in columns and rows. The resistive memory devices in each row of the array are interconnected by a respective bitline; whereas, the resistive memory devices in each column of the array are interconnected by a respective wordline. Each resistive memory device in the array of resistive memory devices has an associated threshold voltage and is configured to store a data value therein as a resistance value.

One or more interface circuits are electrically connected to each bitline in the array of resistive memory devices and electrically connected to each wordline in the array of resistive memory devices. The at least one interface circuit cooperatively operates with the array of resistive memory devices to perform an arithmetic operation on data values stored in the array of resistive memory devices.

In one embodiment, each resistive memory device in the array of resistive memory devices is configured to exhibit a high resistive state and a low resistive state, where the high resistive state represents a zero and the low resistive state represents a one.

To perform an addition operation, a voltage is applied to each bitline in the array of resistive memory devices and output current is measured on one or more of the wordlines in the array of resistive memory devices, such that magnitude of the output current on a given wordline indicates a number of ones stored by the resistive memory devices in the respective column. The voltage applied for the addition operation is lower than the threshold voltage of the resistive memory devices.

A vector-matrix multiplication can be performed by collecting the currents from multiple columns in the array of resistive memory devices.

A vector-vector multiplication can also be performed by collecting current of one or more selected columns in the array of resistive memory devices.

In another aspect, the interface circuits are configured to copy data values in a given crossbar module between rows or columns of the array of resistive memory devices in the given crossbar module. For example, the interface circuit copies data values between rows of the array of resistive memory devices by resetting resistive memory devices in a destination row to a high resistive state and subsequently applying a write voltage between the bitline of the destination row and the bitline of the source row, where the write voltage is greater than the threshold voltage of the resistive memory devices. In another example, the interface circuit copies data values between rows of the array of resistive memory devices by applying a bias voltage to select wordlines in the array of resistive memory devices while applying a write voltage between the bitline of the destination row and the bitline of a source row, such that data values in columns corresponding to the selected wordlines are not copied from the source row to the destination row.

In yet another aspect, the interface circuit cooperatively operates with the array of resistive memory devices to perform neuromorphic computing through vector multiplication between an input vector and a weight vector, where n columns in a given array of resistive devices store n bit weights therein.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 4A-4C are diagrams showing how to count the number of ones in a portion of a crossbar module;

FIG. 5 is a diagram of an example crossbar module with all tiles filled with random data patterns except for one pattern filed with staircase like data to verify the ability of counting the number of ones;

FIG. 10A is an original image; whereas.

FIG. 15 is a diagram showing simulation results for the data shift operation;

Corresponding reference numerals indicate corresponding parts throughout the several views of the drawings.

DETAILED DESCRIPTION

Example embodiments will now be described more fully with reference to the accompanying drawings.

Figure 1:
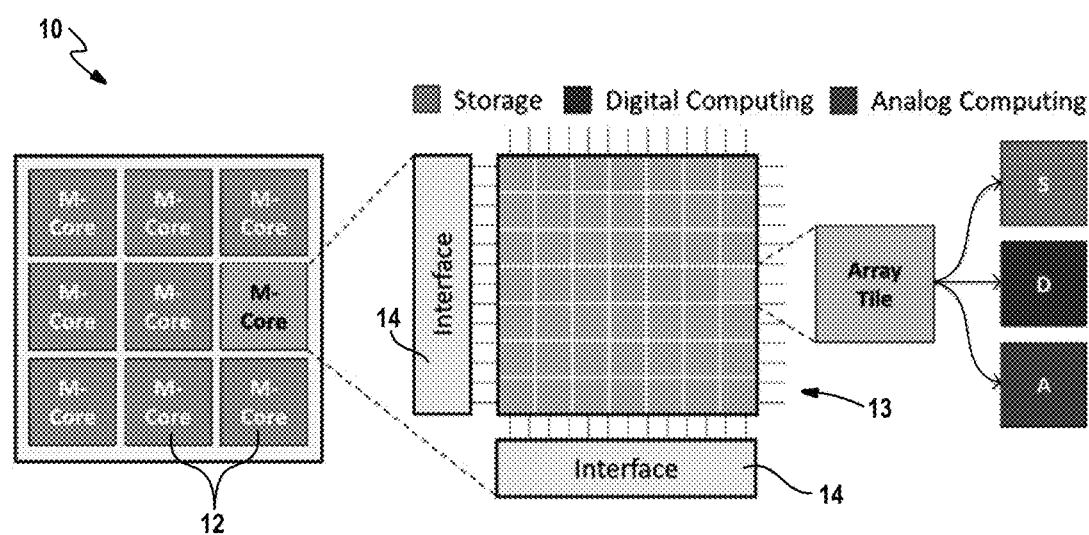
FIG. 1 is a block diagram depicting a field-programmable crossbar array architecture.

FIG. 1 depicts a field-programmable crossbar array (FPCA) architecture 10 for reconfigurable computing. The FPCA architecture 10 is organized in an array hierarchical structure, where the top layer is composed of crossbar modules 12 (Memory cores, M-Cores). Each M-Core 12 is a single crossbar or an array of crossbars that can compute with/in local memory. Each M-Core 12 is further divided (virtually) into a set of tiles. While all the tiles are physically identical, each of them can be dynamically re-configured to perform one of three different jobs: storage (S), digital computing (D), or analog computing (A). Therefore, the system can offer different modes of operations at the fine grain scale. As will be shown later, this approach provides natively scalable, reconfigurable and energy-efficient computing.

Figure 2:
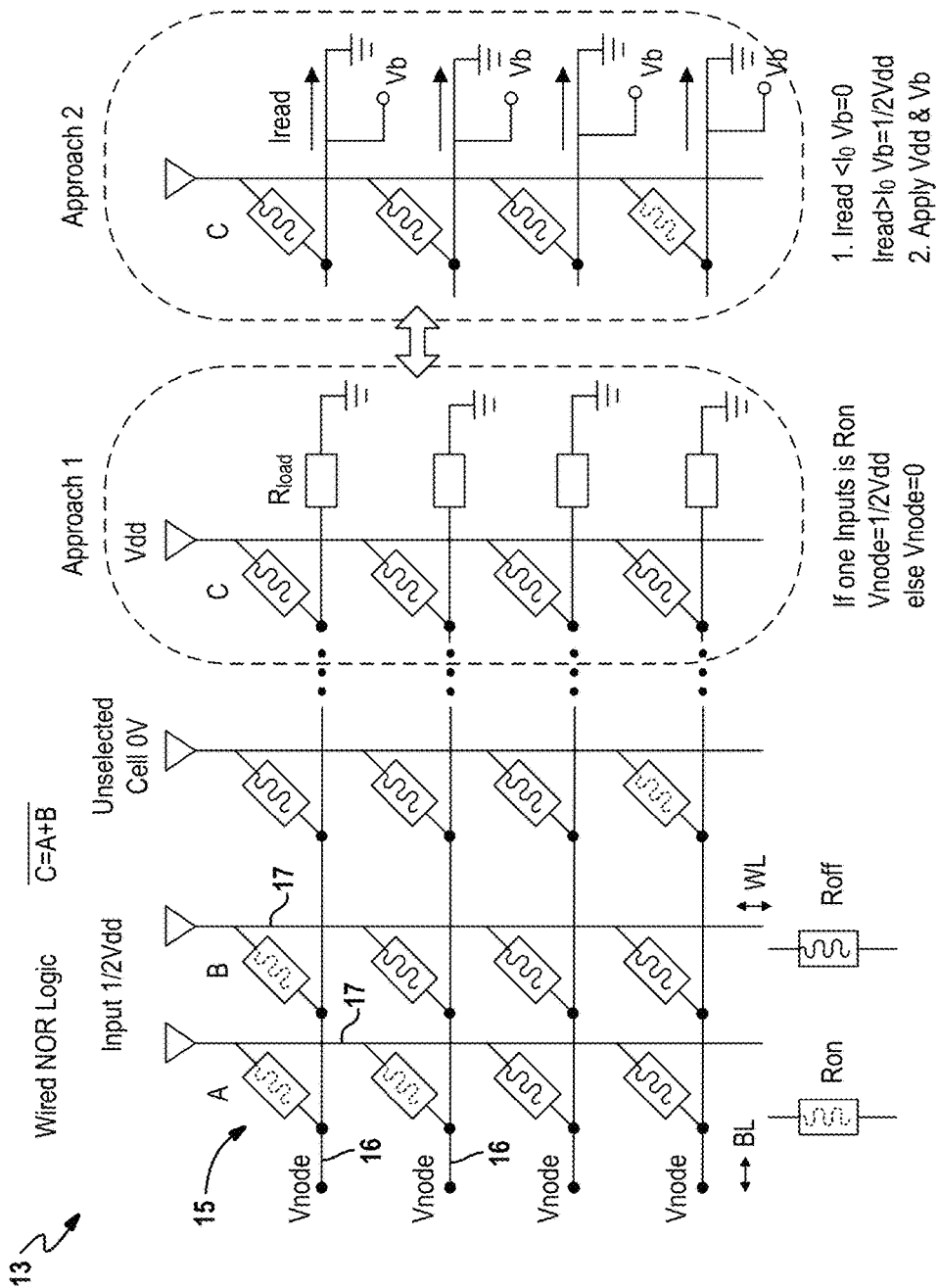
FIG. 2 is a schematic of an example crossbar module.

More specifically, each crossbar module 12 is comprised of at least one interface circuit 14 and an array of resistive memory devices 13. The resistive memory device 15 are arranged in columns and rows as better seen in FIG. 2. The resistive memory devices 15 in each row of the array are interconnected by a respective bitline 16; whereas, the resistive memory devices 15 in each column of the array are interconnected by a respective wordline 17. Each resistive memory device 15 in the array of resistive memory devices is configured to store a data value therein, represented by the resistance value of the memory device. Further details regarding an example crossbar module 12 can be found in "Efficient In-memory Computing Architectures Based on Crossbar Arrays" by Bing Chen et al, 2015 IEEE International Electron Devices Meeting (IEDM), which is incorporated in its entirety by reference.

Figure 3:
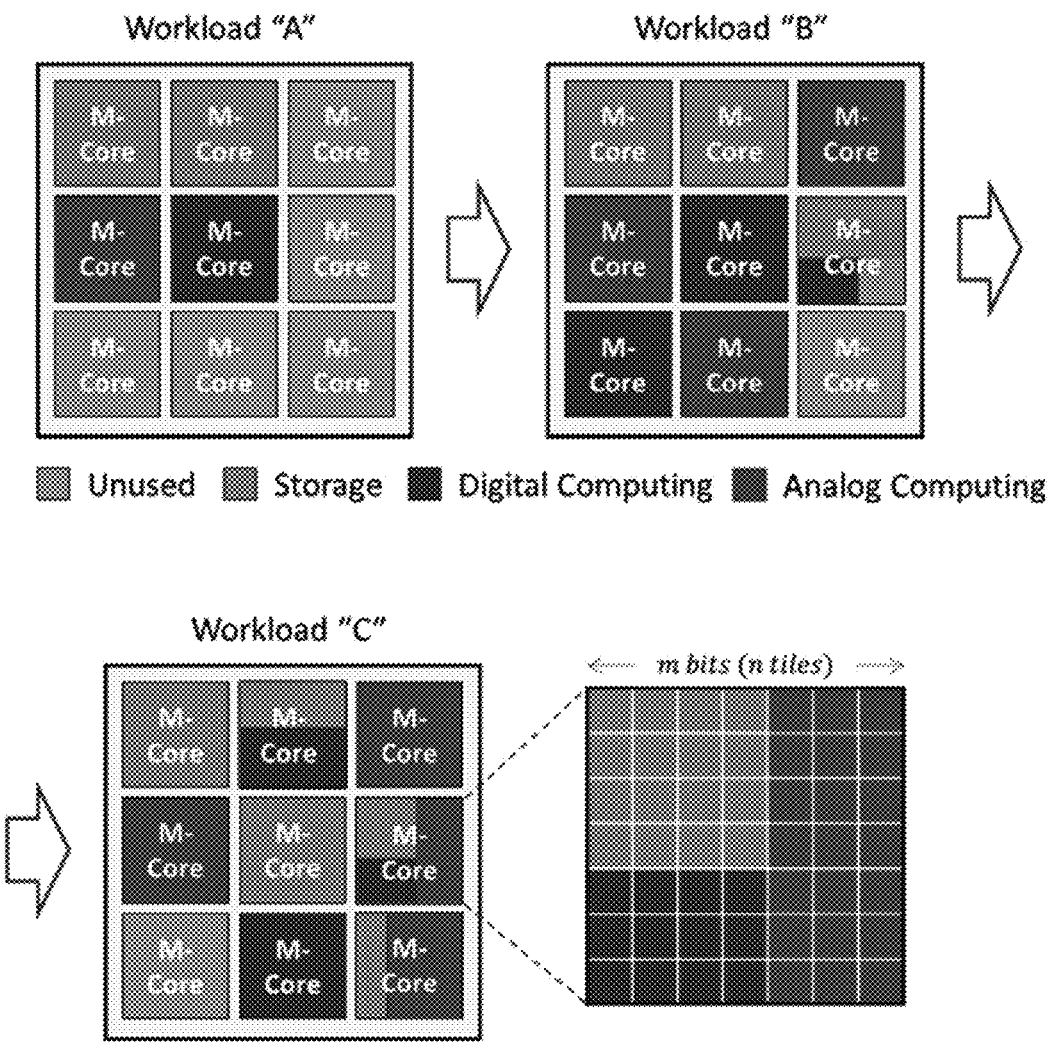
FIG. 3 is a diagram showing different configurations of the field-programmable crossbar array architecture.

The new computing system can be configured either at the system level or the core level. In the first approach, a whole M-core is assigned to a particular type of jobs, for example assigning one of the cores to analog computing tasks. This core can be later reassigned to digital computing or just used as storage space at any moment of time based on the needed computational resources. Finer grain configuration can be achieved by assigning different tiles of a given core to perform different tasks. Such low-level configuration is optimal for data processing and analysis, where the stored data can be processed by the same core in either digital or analog schemes, without the need to move the data back and forth between processing and storage cores. A more generic approach allows the resources to be reconfigured on the two layers simultaneously based on the nature of the workload, as shown in FIG. 3. This system reconfigurability is equivalent to having a pool of generic resources, where they are assigned to perform specific tasks based on the workload requirements. The system configuration dynamically changes with the change of the workload. Finally, it should be noted that one of the essential characteristics of the proposed architecture is being natively modular, parallel, and reconfigurable. This allows a system to scale simply from a small IoT smart node to a supercomputing type of architecture.

Besides reconfigurability, another main aspect of the design of the FPCA system 10 is the energy-aware computing. From an energy prospective, there is no global approach for energy efficient computing. For instance, small and medium computing systems require energy efficient partial or fully sleep mode, as smart nodes and mobile devices. FPCA achieves this by utilizing the nonvolatile property of its resistive memory devices, where the system can go to a zero-power sleep mode without the need to keep track of the system state. On the other hand, a large computing system requires an energy efficient data delivering and an extremely parallel processing units, which are the core properties of the FPCA architecture. Added to this multi-domain computing where tasks are processed on the more efficient domain either analog or digital enables the FPCA to be natively energy efficient computing system.

All of the attractive properties of the FPCA architecture 10 is based on the ability of a crossbar module to be reconfigured to perform different tasks. The major challenge of the FPCA is to design various computing and storage techniques sharing a common physical structure, which is an M-core. This starts by selecting the right resistive memory candidate. In the example embodiment, the resistive memory device is a binary memristor devices, for example as described by S. H. Jo, K.-H. Kim and W. D. Lu in "High-density crossbar arrays based on a Si memristive system," *Nano letters*, vol. 9, no. 2, pp. 870-874, 2009 which is incorporated in its entirety by reference. These devices are known for their high density, low power consumption, and fast access speed, and are often called resistive random-access memory (RRAM). Such outstanding properties make them widely considered as a futuristic replacement for Flash-based SSD and CMOS RAM, although computing based on binary memristors has been less explored compared to their analog counterparts. In this disclosure, techniques are proposed to optimally utilize the binary memristor devices for both digital and analog computing, besides using them as data storage devices. With this approach, all three subsystems (storage, analog and digital computing) are based on common system resources to allow the computing tasks to be performed in an efficient manner, as further described below.

The FPCA system 10 relies on recent advances in RRAM technology to provide the system with its computational and storage capabilities. Only a small CMOS component is required to provide certain functions such as interface and control circuitry. In this regard, the CMOS system can be considered as the accelerator component while the M-Cores perform the general computing tasks. A monolithic approach is used to build a 3D computing chip, where the high-density memristor crossbar is fabricated on the top of the CMOS interface and control circuitry. The memristor crossbar fabrication requires low thermal budget, and hence it can be safely fabricated on top of a typical CMOS process. Moreover, since the high-density crossbar is the core element in the system, this relaxes the feature size requirement for the CMOS layer. Such CMOS layers will host the analog interface for the M-Cores, which includes analog multiplexers (MUXs), digital-to-analog converters (DACs), and analog-to-digital converters (ADCs). This will allow parallel access to a full tile in each M-Core. Also, the CMOS layers will host fast interconnect medium as well as digital periphery circuitry. In one embodiment, the CMOS/RRAM integration will follow a previous approach, where successful CMOS/RRAM hybrid systems have been demonstrated for memory applications as described by K.-H. Kim, S. Gaba, D. Wheeler, J. M. Cruz-Albrecht, T. Hussain, N. Srinivasa and W. Lu. in "A functional hybrid memristor crossbar-array/CMOS system for data storage and neuromorphic applications," *Nano letters*, vol. 12, no. 1, pp. 389-395, 2011 which is incorporated in its entirety by reference.

Arithmetic is the foundation of any digital computational system, where the strength of digital computers is commonly measured in FLOPS (floating point operations per second). Almost every arithmetic operation relies on a tree reduction circuit as multiplication, division, trigonometric operations, matrix operation and multi-operand addition. In tree reduction, multi-operand additions are transferred into a single two-operand addition. This process may sound straightforward, but it consumes most of the arithmetic units' area and energy budget. Typically, tree reduction is realized using successive stages of arithmetic compressors (i.e., a generalized form of full adders). There are various flavors of the arithmetic trees, where a tradeoff between the area and speed is often achieved. However, all of the approaches are built around the idea of stacking and looping over arithmetic compressor units. An arithmetic compressor mainly counts the number of ones per input. For instance, an n-operand adder is just a group of stacked arithmetic compressors.

An approach is set forth to perform massively parallel arithmetic operations on an M-core crossbar structure, where the crossbar structure is utilized as a giant arithmetic compressor. In the presented technique, multiple tree reduction operations can be performed simultaneously on the same crossbar array. Moreover, masked tree reduction is also available, eliminating the need for extra logic gates for many of the arithmetic operations such as multiplication for example. This allows M-cores to perform in-place parallel digital processing.

The arithmetic-reduction operation is the operation of transforming multi-operand addition into two-operand addition. Such transformation is typically done by counting the number of ones per column of the multi-operand addition elements. Rather than using the classical arithmetic compressors to perform such the counting task, this disclosure relies on an in-memory counting. The proposed arithmetic compressor relies on relating the column readout current to the number of ones it contains. This can be performed on the whole column or a particular region of interest. Referring to FIG. 4A, the output current of a given column is described as, $$I_{out} = V_r \sum \frac{1}{R_i}$$

Knowing that $R_i=\{R_{on}, R_{off}\}$ and $R_{off} \gg R_{on}$, the output current can be rewritten as, $$I_{out} \approx N_{ones}(V_r/R_{on})$$

where "$N_{ones}$" is the number of ones in the column, and "$V_r/R_{on}$" is a constant value. In an example embodiment, a voltage is applied to each bitline in the array of resistive memory devices and the output current is measured on one of more of the wordlines in the array of resistive memory devices, such that magnitude of the output current on a given wordline indicates a number of ones stored by the resistive memory devices in the respective column. This current is simply translated into digitized value with the aid of the interface circuitry of the M-core. That is, the interface circuit transforms the crossbar readout current into binary bits. This operation is used in different arithmetic and logic tasks.

Referring to FIG. 4B, a masked version of the tree reduction can be achieved by only biasing the rows of interest. This significantly simplifies multiplication and division operations by eliminating the need for AND gates. In such case, the output current is written as, $$I_{out} = \frac{V_r}{R_1} + 0 + \frac{V_r}{R_3} + \frac{V_r}{R_4} + 0 + \ldots$$

which is equivalent to the following summation, $$S = A \wedge W + B \wedge X + C \wedge Y + D \wedge Z + \ldots$$

where the equation is written using dummy variables. The simple circuit realization of this equation is the key to the crossbar-based arithmetic calculations. The masked reduction can be extended to multiple columns in a natively parallel fashion as shown in FIG. 4C.

To verify the proposed concept, a crossbar module consisting of 256 tiles is simulated, each of which is in turn 1 k bits in size. One of the tiles is filled with a staircase pattern with an increasing number of ONEs per column as shown in FIG. 5. All the other tiles are filled with random data, and the system is simulated with more than 44k different data patterns. The purpose of these simulations is to verify the ability to count the number of ONEs regardless the content of the surrounding tiles. Expected parasitic nonlinearities were included in the simulations to make the simulation as realistic as possible. All the rows and columns of the tile of interest are activated simultaneously, where the number of ONEs per column for all the tile columns are obtained at the same time. Besides increasing the degree of parallelism, the full tile access reduces the sneak paths effect significantly.

Figure 6A:
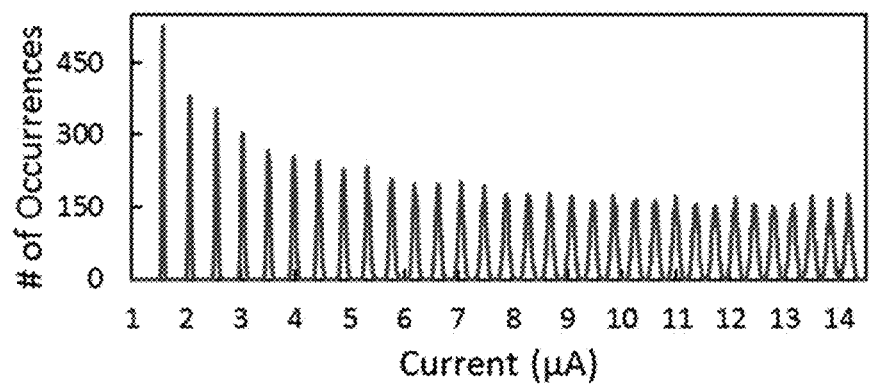
FIGS. 6A-6C are graphs showing the simulation results as a distribution of output current levels from different columns, where the array connectivity is grounded terminals, half-selected terminals and floating terminals.
Figure 6B:
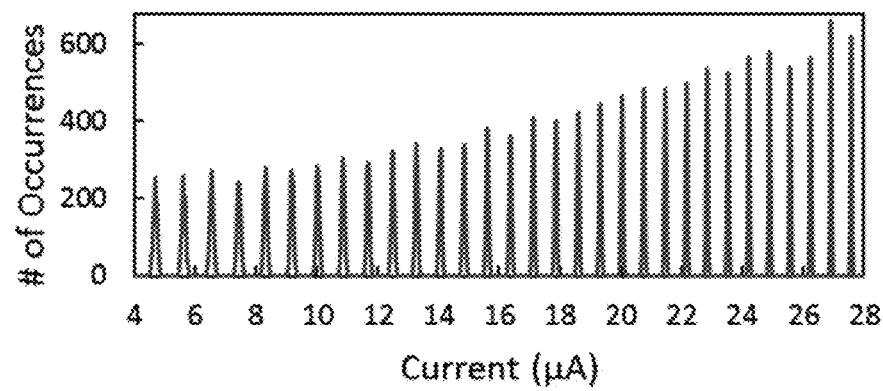
Figure 6C:
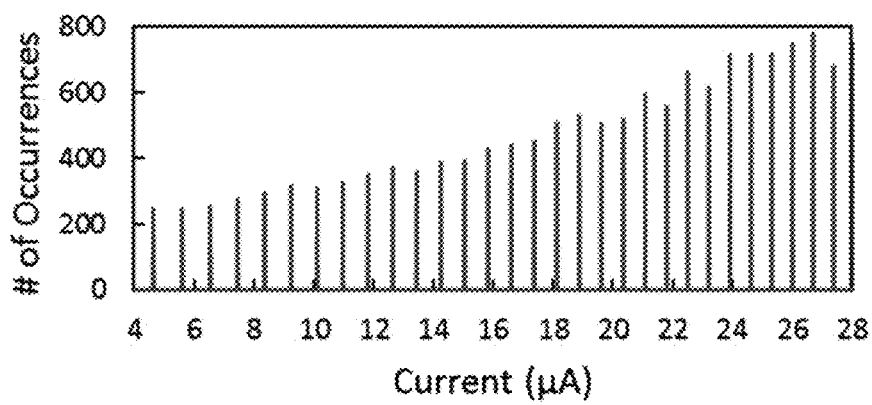

FIG. 6A-C show the simulations results as a histogram distribution of different output current levels, where each current level is equivalent to the different number of ONEs. The results indicate that the centers of the output distributions are equally spaced from each other, where each step in the current is equivalent to an extra ONE in the column count. The system is simulated multiple times with different techniques for connecting the unselected rows and columns. It turns out that the worst connectivity method is grounding the unselected rows and columns, and the best one is to keep them floating although the half-selected approach leads to similar performances. This is because grounding the rows and columns amplifies the bitline/wordline resistance effect in the case of multiple rows activation. Hence, the measured current at columns of interest will depend on the crossbar content. Moreover, this increases the total power consumption because of the parasitic current component. On the other hand, the floating terminals effectively utilize the high nonlinearity of the memristor device. This is clearly visible in FIG. 6C, where the current distribution is minimal, and the current step per added one is larger than the grounded case. This allows much more margins for thermal noise and device variability. Finally, it worth mentioning that the total crossbar power consumption for counting the number of ONEs in a given tile is 4.33 mW, 1.1 mW, and 1.06 mW for grounded, half-selected, and floating terminals connection schemes, respectively.

Being able to perform parallel tree reduction using the crossbar structure allows the implementation of various arithmetic operations on this parallel structure. The first example is a parallel vector addition as, $$A + B + C = \text{reduction}\begin{pmatrix} A_2 & A_1 & A_0 \\ B_2 & B_1 & B_0 \\ C_2 & C_1 & C_0 \end{pmatrix}$$

Such vector addition requires a single step unmasked tree reduction using the FPCA architecture 10. This parallel operation is valid for any number of the bit width. The parallel addition can be extended to a more complex operation with the aid of masked tree reduction. For instance, assume a multiplication operation. In the case of two 3-bit operands multiplications, one needs to reduce a simple tree of 3-rows depth, such that, $$A \cdot B = \text{reduction}\begin{pmatrix} & & B_0A_2 & B_0A_1 & B_0A_0 \\ & B_1A_2 & B_1A_1 & B_1A_0 & \\ B_2A_2 & B_2A_1 & B_2A_0 & & \end{pmatrix}$$

This can be simply extended to vector dot product as, $$[A, B] \cdot \begin{bmatrix} C \\ D \end{bmatrix} = \text{reduction}\begin{pmatrix} A_0C_2 & A_0C_1 & A_0C_0 \\ B_0D_2 & B_0D_1 & B_0D_0 \\ A_1C_2 & A_1C_1 & A_1C_0 \\ B_1D_2 & B_1D_1 & B_1D_0 \\ A_2C_2 & A_2C_1 & A_2C_0 \\ B_2D_2 & B_2D_1 & B_2D_0 \end{pmatrix}$$

Here, this tree needs to be translated to a crossbar implementation with a minimal data movement.

Figure 7A:
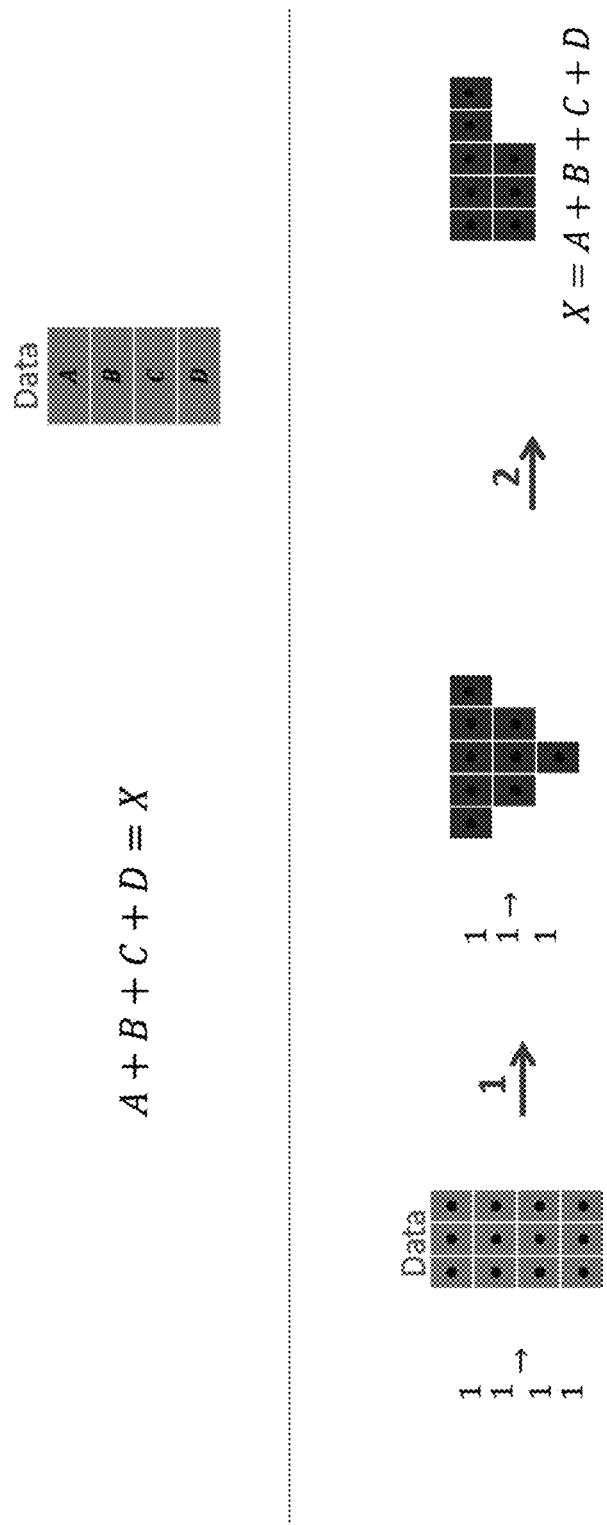
FIG. 7A is a diagram illustrating multi-operand addition using a crossbar module.

With reference to FIG. 7A, an example arithmetic compression technique for multi-operand addition is set forth as follows. The arithmetic compression technique is an iterative addition process until the number of operands is reduced to two. Steps for the arithmetic compression technique are as follows: a) through the interface circuitry (e.g. through the DACs), apply read voltage ($V_r$) to all the crossbar rows containing the data of interest; b) digitize the readout current of all the columns of interest (through the interface circuitry, e.g. using the ADCs), where the columns current is proportional to the number of ONEs per column within the activated row region; c) write back the value of counted ONEs (as intermediate data) to new rows in the respective columns in the M-core; d) apply read voltage ($V_r$) to the original data rows and the intermediate data rows; e) digitize the readout current of all columns of interest; f) overwrite the intermediate data with the new iteration results; and repeat steps d) to f) until reaching a two-operand addition case (i.e., two rows of interest).

Figure 7B:
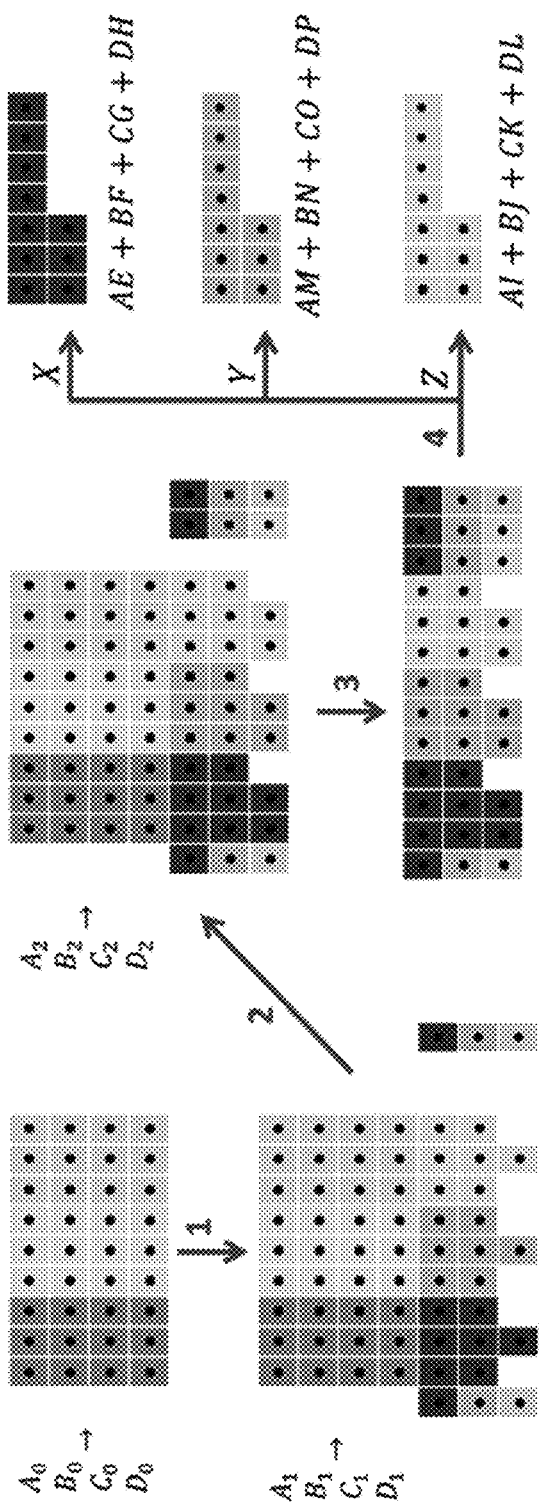
FIG. 7B is a diagram illustrating vector-matrix multiplication using a crossbar module.

This algorithm can be extended to a vector-matrix multiplication as illustrated in FIG. 7B. Although vector-vector can be implemented as well, vector-matrix multiplication is more parallel than the vector-vector one and requires the same number of steps. Steps for an example masked compression technique for vector-matrix multiplication is set forth as follows: a) split the data into the multiplier vector and the multiplicand vector; b) use the first bit values of the multiplier vector to activate the multiplicand data rows, where reading voltage ($V_r$) is applied to a row in case of "1" multiplier bit and otherwise, the row is kept floating; c) digitize the readout current of all the columns of interest, where the columns current is proportional to the number of ones per column within the activated row region; d) write back the readout results to the M-core within the same columns of the original data; e) use the next bit values of the multiplier vector to activate the multiplicand data rows, and activate the compressed data rows in parallel; f) repeat steps c) to d) for all the whole multiplier vector width; g) apply read voltage ($V_r$) to the compressed data rows; h) digitize the readout current of all the columns of interest; i) overwrite the compressed data with the new iteration results; and repeat steps g) to i) steps until reaching a two-operand addition case (i.e., two rows of interest). It should be noted that for optimal performance data should be arranged in an aligned format, as shown in FIG. 7B, where the ones counting can be done in minimal steps.

These two operations are merely illustrative of the different operations that can be performed by the FPCA system 10. Using the same scheme, matrix-matrix operation can be performed on the crossbar structure. The proposed strategy applies to any tree-reduction based arithmetic operation, that is, typically every arithmetic operation other than incrementing or two-operand addition. It should be noted that the final output of the tree reduction is always a 2-operand addition operation, which can be performed sequentially on the crossbar or a simple 2-operand adder in the system's CMOS layer.

Another important aspect of the FPCA architecture 10 is the implementation of neuromorphic computing techniques. This approach is generally inspired by how the biological brain processes data, where parallel networks are used to execute complex operations. Such computational technique is extremely power efficient to process congestive applications compared to classical processors. Neuromorphic networks try to mimic the basic computing concepts of real neural networks, by taking advantage of parallel processing to execute complex operations based on the idea of pattern matching, typically through multiplications of the inputs and with stored analog "weights" and accumulate the resulting outputs. In this disclosure, this analog "multiplication and accumulate" technique is extended to multiplications using binary resistive memory devices, so that data storage, arithmetic, and neuromorphic computing can be achieved on a single hardware platform. This versatility, in turn, allows the functional tiles to be readily reconfigured and redefined through software, to compute different tasks optimally. Moreover, using binary devices for neural computing has many advantages over using analog devices. For example, the binary version of weights ensures reliable storage. The high ON/OFF ratio of binary devices and their nonlinearity further improves the reliability and efficiency of the system.

Figures 8A, 8B:
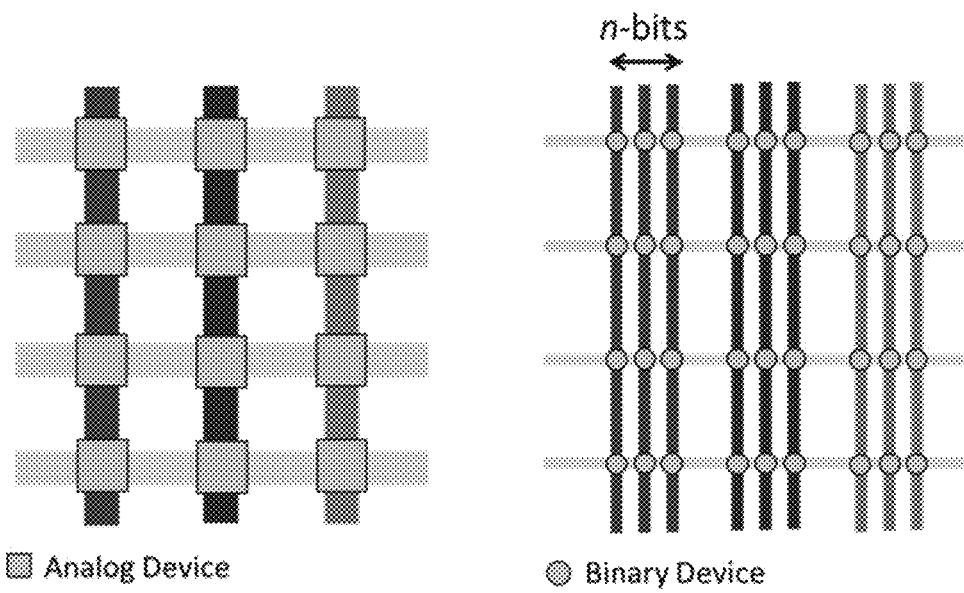
FIGS. 8A and 8B are diagrams depicting a conventional neural network and a binary coded neural network, respectively.

In the proposed mapping of neuromorphic computing onto binary memristor devices, the weights are encoded into n-bit binary representations and stored on n-devices rather than a single analog device. However, one still uses analog input and output for the network interface. Each column in a traditional network is replaced by n-columns in the binary coded neural network as shown in FIGS. 8A and 8B. In this case, each neuron will be connected through n-columns rather a single one, where these columns are equivalent to one analog column.

The concept of using crossbar structure in neural computing is based on its native ability to sum the currents passing through the devices connected to a given column and supply the accumulated current to the column's output (termed an output neuron). This process is equivalent to performing an analog dot-product operation of the input vector and the weight vector. The same basic concept applies to the proposed binary coded neural network. That is, most neural network operations can be parsed into vector-vector dot-product operations. The vector-vector dot-product operation is efficiently implanted in a memristor crossbar by applying the inputs as voltage pulses to the crossbar's rows, and collect the columns' output currents. The current at a selected column is proportional to the dot-product of the input voltage vector and the devices' conductance vector from the devices connecting the inputs to the selected column. In this case, the memristors act as synapses connecting the inputs and outputs as shown in FIG. 8a. The same technique applies to the M-cores. However, in the M-cores, instead of using analog devices with multilevel device conductance values, one synapse having an analog weight is now implemented with multiple binary devices. In this case, a regular analog crossbar column is distributed over multiple binary ones, as shown in FIG. 8b.

For example, in the case of representing each synaptic weight with 4-bits, each output neuron will be connected to 4 columns rather than one. The output current of each of the four columns represents the summation of the input current multiplied by the binary weight of this column. The analog dot-product is then a scaled summation of the four columns output. The output current of each of the four columns is scaled according to its order in the binary word, where the first column current is taken as is, the second column output is divided by two, and so on. In other words, each synapse is represented by four binary memristor devices. Each analog neural column is then represented by four physical columns in the M-core in this example. If one needs to perform a forward pass over a neural network implemented in the M-core, the controller will apply the network input as a voltage pulse (amplitude or width modulated) to the crossbar's rows. The currents are then sampled from the columns' side. The outputs from the four columns representing one neuron output is added together (with respectively the binary digit position) to reconstruct the correct network output.

In the cases of adopting digital neurons, each column output is digitized before processing, and the output scaling is equivalent to division by the power of two and achieved by simply shifting the output wiring. A typical digital neuron is mainly built of ADCs and Adders, which is exactly the same interface required by the two other FPCA operations, namely, the digital computing and data storage. Therefore, the binary coded neural network uses the exact same devices and circuit interface as the other FPCA subsystems. Hence, building a heterogeneous computing system with a single building block is now possible.

Figures 9A, 9B:
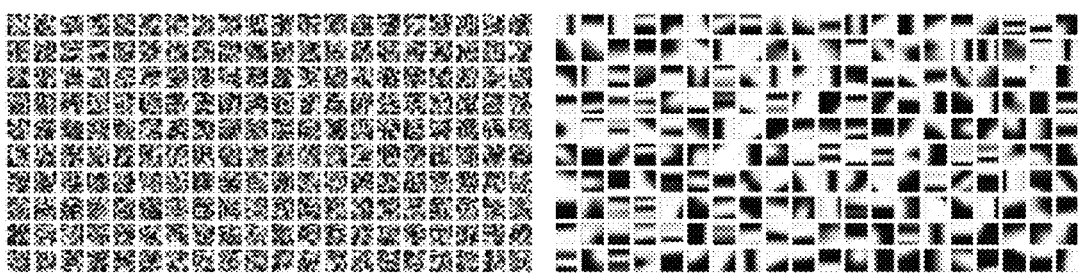
FIGS. 9A and 9B show an original state and a trained set of dictionaries trained using a binary coded neural network.
Figure 10A:
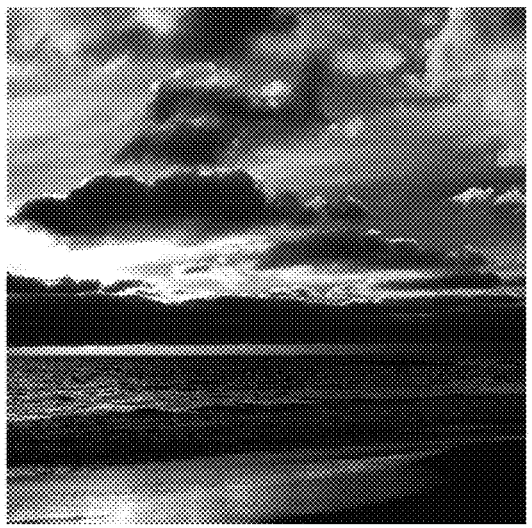
Figure 10B:
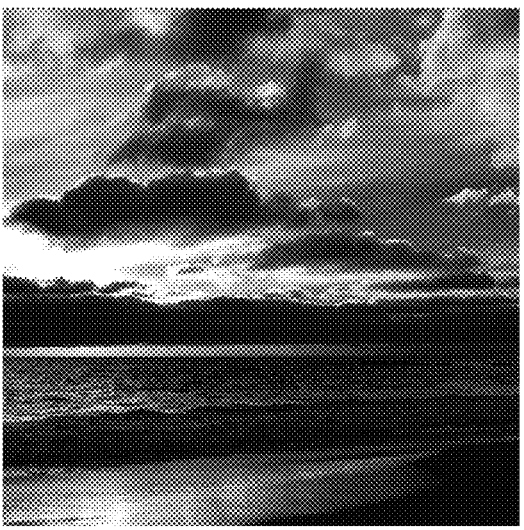
FIGS. 10B-10D are reconstructed images using locally competitive algorithm (LSA) on the binary coded neural network with sparsity level is less than 0.1, equal to 0.1 and equal to 0.25, respectively.
Figure 10C:
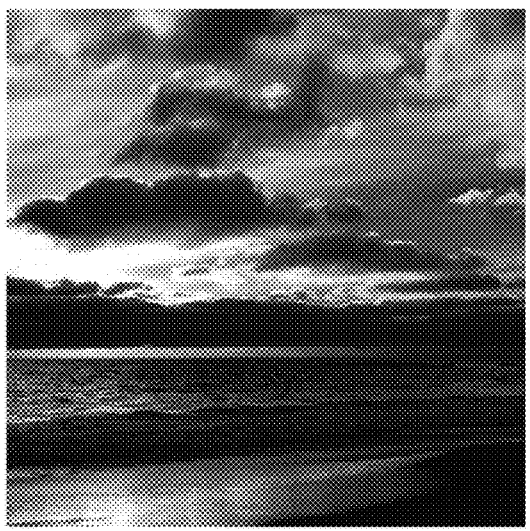
Figure 10D:
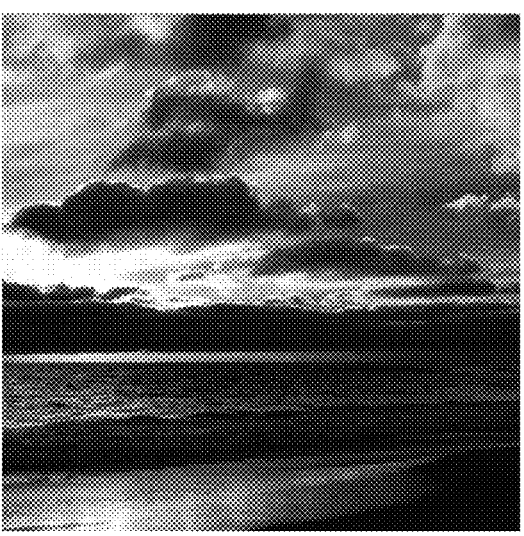

To verify the proposed concept, an analog image compression was performed on an M-Core structure. First, the network is trained with a set of training images using winner-take-all and Oja's rule, where the memristor crossbar acts as the synaptic network along with digitally realized leaky integrate and fire neurons. The synaptic weights update rule for the winning column is given as, $$\Delta w = w_{i+1} - w_i = \eta y_i(x_i - w_i y_i)$$

where "$\Delta w$" is changed in the synaptic weights between the instances "i" and "i+1", "$\eta$" is the learning rate, "$x_i$" is the network input, and "$y_i$" is the membrane potential of the winning postsynaptic neuron. The winning neuron is identified by feeding the input to the network, and comparing the obtained dot-product of the input and the weights using the technique discussed above, with the neuron having the largest dot-product identified as the winner. FIGS. 9A and 9B show the learned features by the network. It should be noted here that the training phase is required a single time, then the trained synaptic weights are reused many times for performing the trained task.

For the image compression and reconstruction, the locally competitive algorithm (LCA) was adopted, which is an analog sparse coding technique and further described by C. Rozell, D. Johnson, R. Baraniuk and B. Olshausen in "Locally competitive algorithms for sparse approximation," *IEEE International Conference on Image Processing (ICIP'07)*, pp. IV-169, 2007 which is incorporated in its entirety by reference. The algorithm aims to represent the image using the trained dictionary set, which results in an analog compressed version of the original image. The LCA can be numerically formulated as, $$u_{i+1} = u_i + \frac{1}{\tau}(\theta - u_i + \eta^T \cdot \phi)$$

where "$u_i$" is the membrane potential of the postsynaptic neurons at step "i", "$\Phi$" is the matrix of synaptic weights, "$\theta$" is the cost function, and "$\eta$" is an error function. The error function is given as, $$\eta = x - \Phi \cdot \theta^T$$

where "x" is the presynaptic membrane potential, which represents the original image under compression. The two dot products "$\eta^T \cdot \Phi$" and "$\Phi \cdot \theta^T$" are implemented using forward and backward propagations through the binary coded neural network, as discussed above. For the cost function, a soft threshold function is used and defined as, $$\theta(u, \lambda) = \begin{cases} 0, & |u| \leq 0 \\ 4u - 3\lambda, & 0.75\lambda < |u| < \lambda \\ u, & |u| \geq \lambda \end{cases}$$

where "$\lambda$" represents the sparsity of the reconstruction, where larger "$\lambda$" means better compression ratio.

FIGS. 10A-10D show the original and the reconstructed images, respectively, using LCA implementation on binary coded neural networks with different levels of sparsity, where each synaptic weight is coded using four binary devices only. Each of the image color channels is treated as a separate input to the network, where each of the three channels is reconstructed separately using the gray scale dictionaries shown in FIGS. 10B. Then the three channels are combined again to form the reconstructed color image. In this example, the YIQ color scheme is used rather than RGB color scheme to reduce intra-channel errors effect to the human eyes.

Modern computing applications require large sized and high-performance memory and storage systems. Hence, high speed, high density, and low cost per bit are the desirable properties of a memory system. However, there is a trade-off between these properties and current computer architecture designs are based on a memory pyramid hierarchy. At the bottom level, there is the large yet slow permanent storage, and at the top level a small and very fast cache memory and processor registers. The goal of the memory hierarchy is to approach the performance of the fastest component and the cost of the cheapest one. Recently, resistive memory devices have emerged as a potential candidate for future memory and storage applications. At the device level, resistive memory offers excellent scalability, fast access, low power, and wide memory margin. These attractive properties make it possible to create a simpler and flatter memory system rather than the complex pyramid memory hierarchy used today. However, a lot of resistive memory devices' attractive features start to vanish at the system level, where nonidealities such as sneak paths and series line resistance limit the system performance considerably and result in a faulty and power hungry memory system, which the system designers were trying to avoid in the first place.

Figure 11:
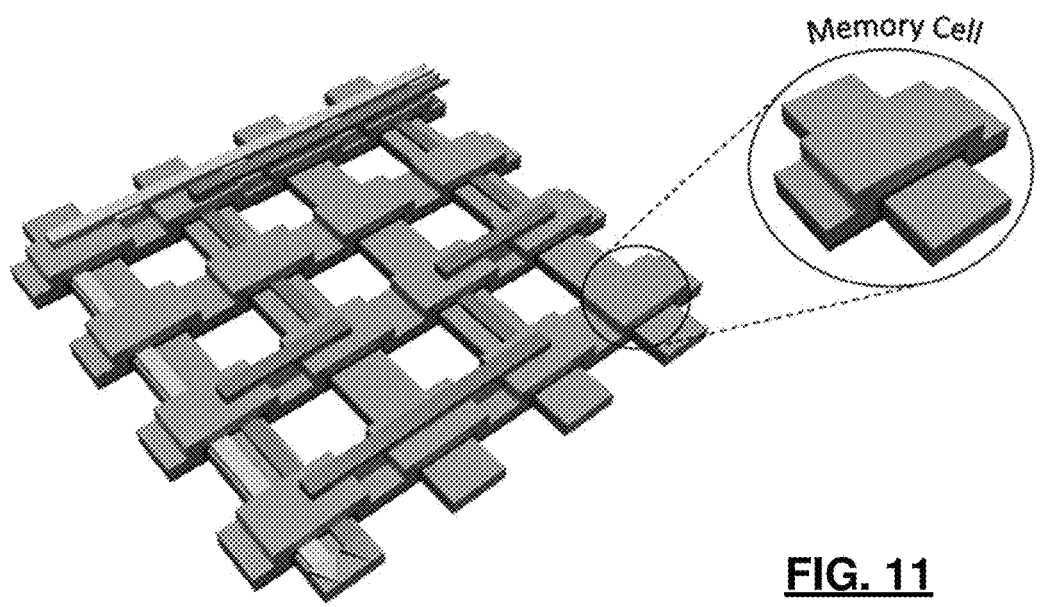
FIG. 11 is a diagram depicting the desired and parasitic currents flowing through a crossbar structure.

The simplicity of the proposed crossbar structure can also be the source of a problem, namely the parasitic sneak paths. While accessing the array, current should flow only through the desired cell. However, current can sneak through other cells in the array as shown in FIG. 11. This parasitic current can ruin the reading and writing operations, and consumes a considerable amount of energy. In previous works, binary memristor devices were fabricated with a built-in selector layer, which significantly increases the nonlinearity of the device, for example as described by Wang, Ming, Jiantao Zhou, Yuchao Yang, Siddharth Gaba, Ming Liu, and Wei D. Lu in "Conduction mechanism of a TaO x-based selector and its application in crossbar memory arrays." *Nanoscale* 7, no. 11 (2015): 4964-4970. In turn, the effect of the sneak-paths and the parasitic power consumption are decreased considerably. Moreover, these devices can operate and switch with a slight amount of power consumption. However, the device outstanding properties do not eliminate the sneak paths interference entirely.

Figure 12:
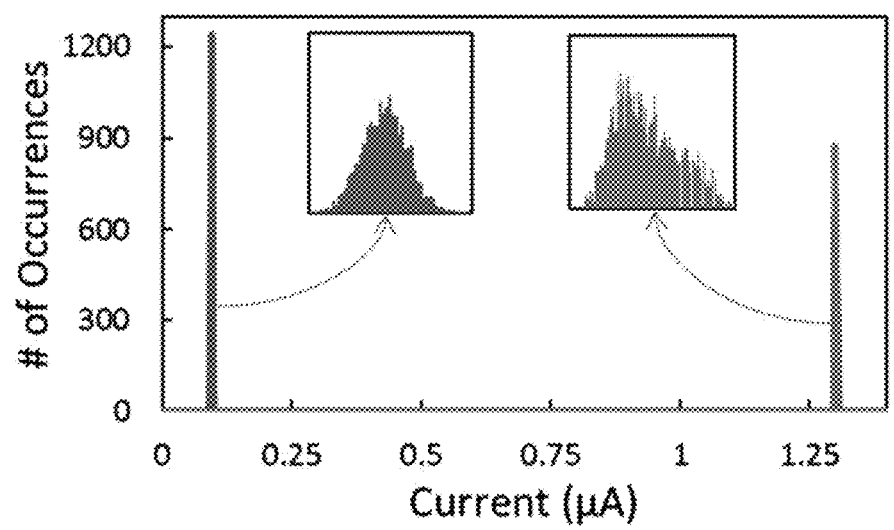
FIG. 12 is a graph showing simulation results for readouts from various cells in a crossbar module.

Most of the techniques presented in the literature to address the sneak-paths problem are based on the typical memory hierarchy structure, where a single cell is accessed in a sub-array at any instant of time. However, this condition is not true for the M-core tiles is the proposed crossbar arrangement, where all the tile columns are activated at once allowing simultaneous reading of a whole tile. In this case, for a tile of size "$n^2$", the sneak-paths interference effect is distributed to "n" cells rather than affecting a single cell. This improves the signal-to-noise ratio of the readout current. Combining this property with resistive memory devices of high nonlinearity (i.e. either intrinsically or with a selector element) can effectively eliminate the sneak-paths parasitic effect. FIG. 12 shows the simulation results for 30 k readouts from various cells in a memory core filled with 30 k random data patterns. The simulation results are based on an accurate circuit model for a crossbar core, where various nonlinearities as the line resistances are considered in the simulations. In addition, an accurate model was adopted for the nonlinear device. The results show a full split in the distributions of the two binary values of data. Such wide separation allows wide margins to accommodate any possible device variations.

Figure 13:
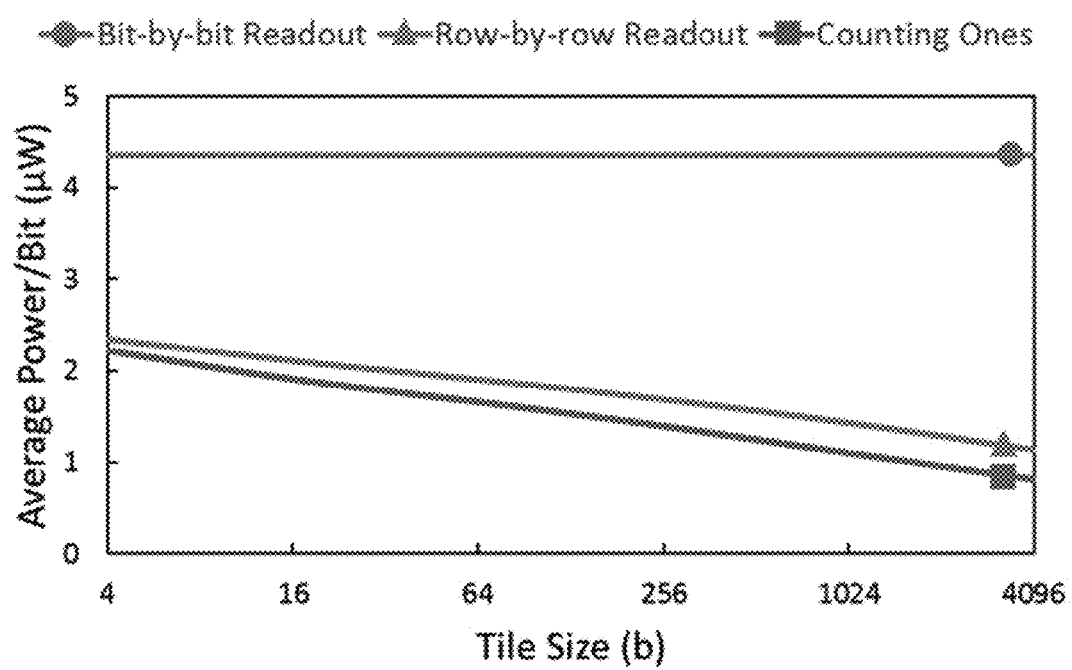
FIG. 13 is a graph showing the average power consumption per bit for various operations in relation to the tile size.

The parallel readout not only improves the noise margins, but also reduces the energy consumption significantly. FIG. 13 shows the average array readout power per bit for various tile sizes. The simulation compares the classical bit-by-bit readout and the M-core based row-by-row readout. For larger tile sizes row-by-row readout saves more than 50% of readout energy. In the same figure, applying an in-memory ONE counting which is the core step for arithmetic operations is also compared. Interestingly, the results show that in-memory counting can be cheaper than just reading the data, which leads to extremely fast and energy efficient arithmetic operations. It should be noted here that there is still a tradeoff between the tile size and the interface circuit size, where larger tiles require larger interface ADC and adders.

Data movement is one of the biggest challenges facing any modern computing system. The proposed architecture directly addresses the von Neumann bottleneck by effectively merging the computing and the storage functions together in a single physical device, and performing efficient in-memory digital and analog computing schemes. However, this does not eliminate the need for data movement completely. An effective, fast technique for internal data migration is presented in this section based on intrinsic properties of resistive memory devices for efficient resource reallocations, matrix algebra, and for moving data between storage and computing tiles. Two types of data migration are proposed. The first one is a shift movement, where data is copied either between rows or between columns. The second migration operation is the tilt movement, where data migrates between rows and columns. The two types of movements combined allow the data transfer to virtually any location in the crossbar array. The proposed data migration techniques utilize resistive memory device threshold and crossbar biasing to allow in-situ data movements. The voltage biasing is designed to use the resistive memory devices threshold to copy from the source cells to the destinations cells without distorting any other memory data.

Figure 14A:
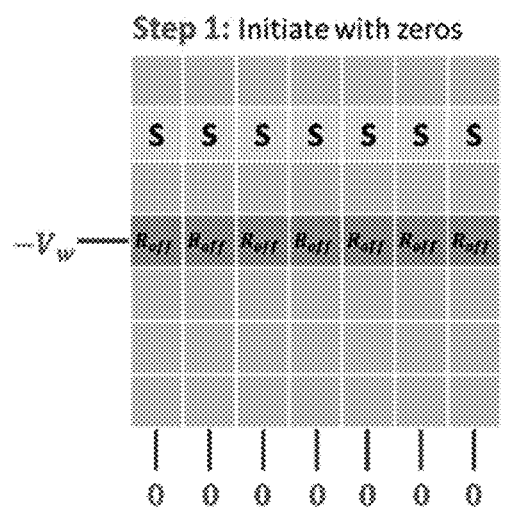
FIGS. 14A-14D are diagrams illustrating an in-situ data shift operation.
Figure 14B:
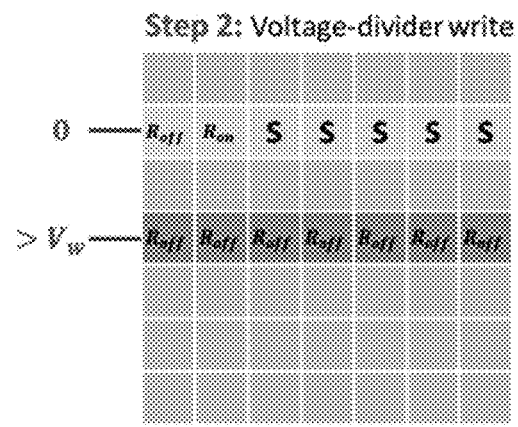

FIGS. 14A and 14B illustrate the data shift method. In a first step, resistive memory devices in a destination row 1401 are reset to a high resistance state, where "zeros" are represented by high resistance ($R_{off}$) and "ones" are represented by low resistance ($R_{on}$). In the example embodiment, the resistive memory devices are reset by applying a reset voltage to the destination row, where the reset voltage has an opposite polarity that of the write voltage (i.e., $-V_w$) and the magnitude is greater than the threshold voltage of the resistive memory devices. During the reset step, the bitlines for the other rows in the array (i.e., not destination row) and the wordlines for the columns in the array have are floating or are protected by a protecting voltage (e.g. half of the reset voltage).

In the second step, a write voltage is applied between the source row and the destination row, such that the magnitude of the write voltage is greater (e.g., 1.25×) than the threshold voltage of the resistive memory devices. This create a voltage divider connection between the rows. In the case the source cell stores a zero ($R_{off}$), the voltage will divide equally on the source cell and the destination cell and no write occurs since the voltage across the destination cell is below the write threshold. In the other case of the source cell stores "one", which is a low resistance state, almost all the voltage will drop over the destination cell and switch it to the low resistance state as well. After switching, the voltage-drop is distributed equally over the two cells causing no more change to the state. Each source and destination cells in the same column (or row) will form a respective voltage divider. Likewise, during the write step, the bitlines for the other rows in the array (i.e., not destination row) and the wordlines for the columns in the array have a floating voltage.

Figure 14C:
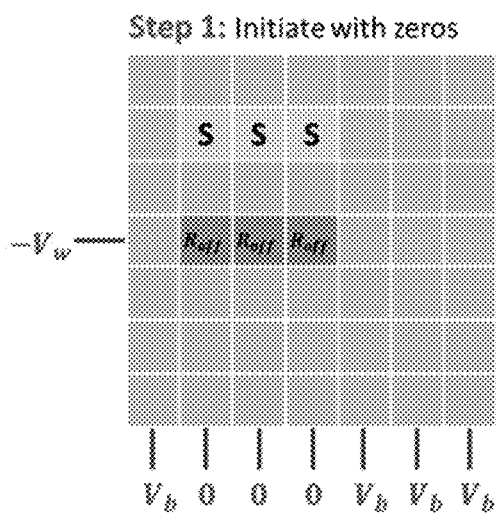
Figure 14D:
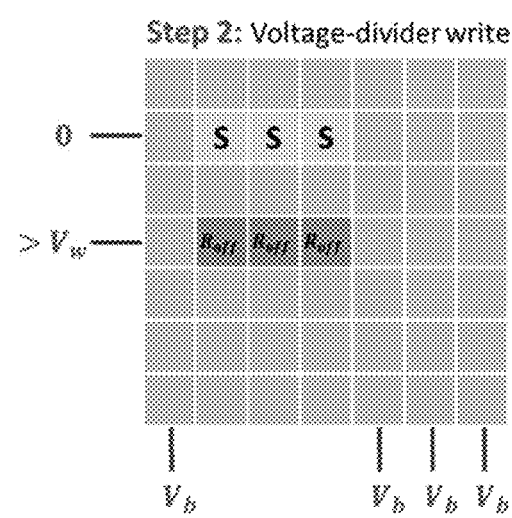

For a partial row (or column) migration, a masked version of the shift operation is utilized as shown in FIGS. 14C and 14D. In the masked shift, a bias voltage ($V_b$) is applied to the undesired cells forcing the voltage drop over them to be below the writing threshold. This will prevent any data migration through the masked (undesired) cells.

Figure 15:
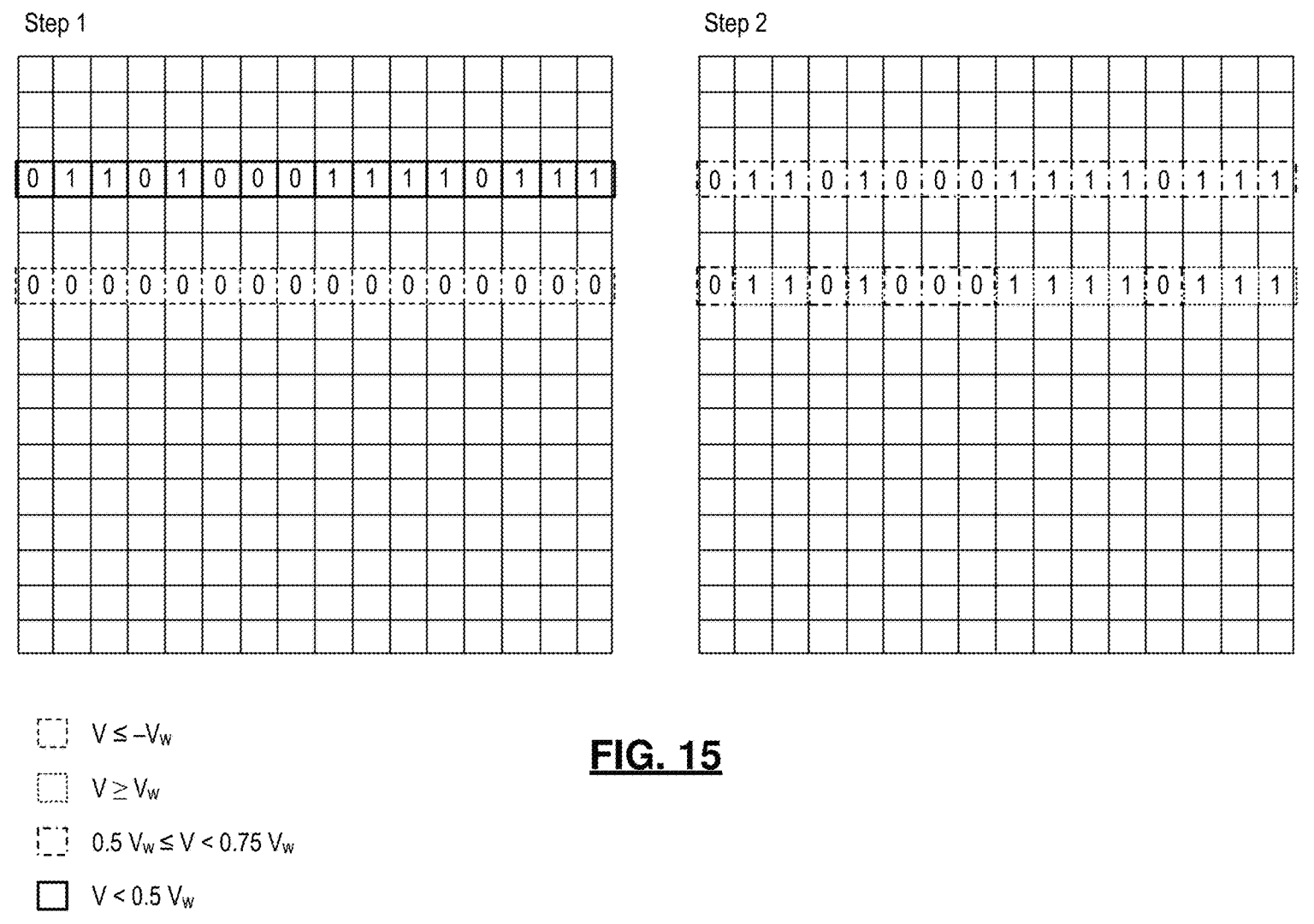

In order to verify the proposed concept, a data shift operation is simulated using an M-core tile in the proposed crossbar arrangement. This simulation uses accurate device model for the memristor device and accounts for the crossbar and interface circuit nonlinearity. FIG. 15A and 15B shows the simulation results along with the designed shift process. In step one, only the desired row will have enough voltage to reset its state. All the other cells in the tile will experience a voltage drop below half the writing threshold. In the second step, the voltage divider scheme applied to the source and destination columns forces some destination cells to the set state based on the source cells value. The simulation results show that the other cells in the source and destination rows will experience a safe voltage drop below three-quarters of the writing threshold. In the same analogy of data shift, the tilt operation follows the same biasing concept utilized in the data shift operations. However, a modified interface circuitry needs to be utilized to allow the data-transpose operations, where the output of the source column (or row) can activate the destination rows (or column). It should be noted that the proposed migration process does not include any data readouts, and hence, the values of the cells being moved do not have to be known.

Figure 16:
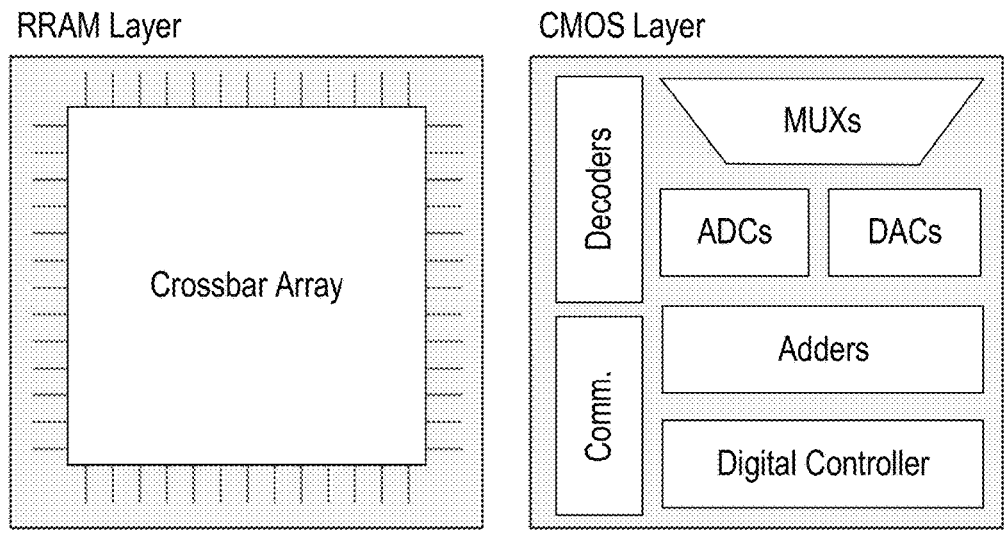
FIG. 16 is a diagram showing example interface circuitry which accompanies a crossbar module.

Crossbar modules (i.e., M-cores) rely on two types of circuitry that are physically stacked over each other. The top layer is the RRAM crossbar, which provides the system with its core computational and storage functionality. Typically, RRAM utilizes a similar structure as dynamic random-access memory (DRAM) based on subarrays, arrays, etc., to reduce capacitive loading and access delays. However, an FPCA architecture is a many-core system where the maximum contiguous RRAM structure is expected to be ~1 Mb per M-core, which relaxes the constraints compared to a typical memory system. Each of the M-cores needs assist circuits as decoders, MUXs, and ADCs, which are built beneath the RRAM array in the CMOS layer. This layer also hosts some digital circuitry used for control and simple processing operations. Moreover, core-to-core data communications are built in the CMOS layer. It should be noted here that one of the main merits of the FPCA system 10 is its in-memory data processing that reduces data communications significantly, and in turn reduces the interconnect circuitry complexity and area. FIG. 16 shows the set of circuitry each of the FPCA layers contains. Taking advantage of the monolithic fabrication of the system, the two layers are connected through the very high-density inter-layer vias (ILV).

To enable the different modes of operations of an M-core, an interface circuitry that supports storage, digital and analog computing is a requirement. Each M-core 12 has input and output interface circuitries (FIG. 1), fabricated in the CMOS layer as shown in FIG. 16. The input circuitry, connected to the rows of the crossbar, includes decoders and voltage driving circuitry, where the voltage driving circuitry has two modes of operations: binary voltage input; and analog voltage input created by DACs. Also, in the analog mode, the input can be encoded either as a variable pulse width or a variable voltage. The binary input case is used for memory and arithmetic operations, while analog inputs are used to operate the neural network tiles. The output circuitry, connected to the columns of the crossbar, is designed to sense the current of the selected column. The current sensing is achieved with the aid of ADCs, where the sensing process is the same for all the three major FPCA operations (Storage, Digital, and Analog). The interface circuit operation is controlled by the software layer, through the controller circuitry in the system. For example, if the controller circuitry is asked by the software to access a memory tile, it will activate the binary driving circuitry and collect the ADCs outputs, where currents from all columns in the tile can be read out in a single step. In the case of arithmetic operations requested by the software, the binary driving circuitry will again become activated. However, in this case, the arithmetic operation, managed by the controller circuitry, is carried out over multiple iterations, with examples discussed in paragraph 45. In the case of neural networks operations, the controller will activate the input DACs and collect the output currents from the ADCs, again possible for all columns in a single step, as discussed in paragraphs 53-56. Here, the exact network function and iterations are determined by the software and the algorithm used. In general, the user software defines which function will be performed by the M-core, with no physical changes to the hardware. The software and the hardware system can also perform dynamic workload distribution over the different functional units to further optimize the system efficiency during runtime. The software commands are implemented in the M-cores through the controller circuitry.

From the storage point of view, a reliable readout circuit for RRAM is preferably made of ADCs and digital adders. The same interface circuit can be utilized for an FPCA digital computing, where the number of bits of the ADC is determined by the tile size. For example, a 32×32 tile requires a small 5-bit ADC. The same interface can also be used to build digital neurons for binary coded neural networks mode of operation. The digital neuron samples the current output and performs the leaky integrate operation using digital adders. In neuromorphic computing implementations, digital-to-analog converter (DAC) circuitry is used to transform the binary data to an analog input.

It worth mentioning that many ADCs contain DACs within its circuitry, which may eliminate the need to implement separate DACs. It is also desirable to keep the RRAM and the CMOS areas balanced, to maximize the FPCA die area utilization. Typically, an M-core 12 can operate with one tile active at a time instance. For a 32×32 tile, 32 units of ADCs, adders, and DACs are needed. However, having abundant CMOS area, multiple interface circuits can be used to activate multiple tiles at ones. This is equivalent to a multi-thread M-core. For instance, a state-of-the-art 5-bit ADC requires less than 0.28% of the crossbar area, if fabricated using 90 nm CMOS technology. This is scaled down to 0.07% in the case of 45 nm fabrication. Finally, it should be noted here that the RRAM MUXs and Decoders can utilize memristive devices for their realization enabling fabricating them on the RRAM layer besides the crossbar array.

Figure 17:
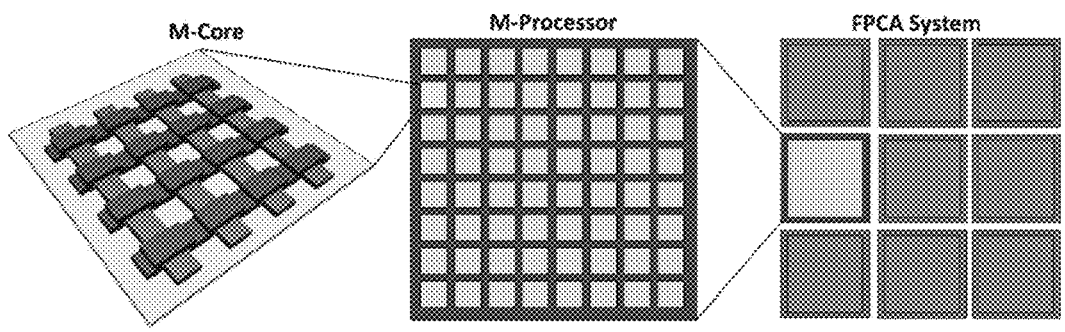
FIG. 17 is a diagram showing scaling hierarchy in the field-program mable crossbar array architecture.

The proposed FPCA relies on medium-sized M-cores to provide computing and storage functionality. Hence, a full system may be composed of many thousands of M-cores. Here arises a major challenge on how the vast number of cores will be connected together. For example, keeping a full connectivity among all the cores is difficult and will limit the system scaling capabilities. Here we propose two levels of hierarchy to enable a modular and scalable computing system, as shown in FIG. 17. The lower hierarchical level is the M-processor, which is made of fully connected M-cores. From a functional point of view, an M-processor is a unit that provides computing capabilities and will be interfaced with the rest of the system digitally. Internally, the M-processor distributes the workload of storage, arithmetic and neuromorphic computing to different tiles (M-cores) based on the workload nature. Hence, from an outside look, an M-processor is treated as a digital processing/memory unit, while internally the computations are performed in both analog and digital domains. In this case, scaling up the system using multiple M-processors turns out to be an achievable task.

At the top hierarchical level, the FPCA system compresses many of the digitally interfaced M-processors with low communication rate between them. The different levels of data communication rates are initiated from the locality property of computer data, where nearby M-cores, within the same M-processor, need to communicate more frequently than cores belonging to different processors. The two-level hierarchy facilitates both the system scalability and internal data communications. Designing the FPCA as a multi-processor many-cores computing system also eases the control and reconfigurablity the system.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A field-programmable crossbar array for reconfigurable computing, comprising:
    a plurality of crossbar modules interconnected together, each crossbar module is comprised of at least one interface circuit and an array of resistive memory devices arranged in columns and rows, such that resistive memory devices in each row of the array are interconnected by a respective bitline and resistive memory devices in each column of the array are interconnected by a respective wordline;
    wherein each resistive memory device in the array of resistive memory devices has an associated threshold voltage and is configured to store a data value therein as a resistance value;
    wherein each resistive memory device in the array of resistive memory devices is configured to exhibit a high resistive state and a low resistive state, where the high resistive state represents a zero and the low resistive state represents a one;
    wherein the at least one interface circuit is electrically connected to each bitline in the array of resistive memory devices and is electrically connected to each wordline in the array of resistive memory devices, wherein the at least one interface circuit cooperatively operates with the array of resistive memory devices to perform an arithmetic operation on data values stored in the array of resistive memory devices
    wherein the at least one interface circuit performs the arithmetic operation by applying a voltage to selected bitlines in the array of resistive memory devices and measures output current on one or more of the wordlines in the array of resistive memory devices, such that magnitude of the output current on a given wordline indicates the number of ones stored by the resistive memory devices in the respective column at the selected bitlines.

2. The field-programmable crossbar array of claim 1 wherein the voltage applied for the addition operation is lower than the threshold voltage of the resistive memory devices.

3. The field-programmable crossbar array of claim 1 wherein the at least one interface circuit performs vector-matrix multiplication by collecting the currents from multiple columns in the array of resistive memory devices.

4. The field-programmable crossbar array of claim 1 wherein the at least one interface circuit performs vector multiplication by collecting current of one or more selected columns in the array of resistive memory devices.

5. The field-programmable crossbar array of claim 1 wherein the at least one interface circuit is configured to copy data values in a given crossbar module between rows or columns of the array of resistive memory devices in the given crossbar module.

6. The field-programmable crossbar array of claim 5 wherein the at least one interface circuit copies data values between rows of the array of resistive memory devices by resetting resistive memory devices in a destination row to a high resistive state and subsequently applying a write voltage between the bitline of the destination row and the bitline of the source row, where the write voltage is greater than the threshold voltage of the resistive memory devices.

7. The field-programmable crossbar array of claim 5 wherein the at least one interface circuit copies data values between rows of the array of resistive memory devices further comprises applying a bias voltage to select wordlines in the array of resistive memory devices while applying a write voltage between the bitline of the destination row and the bitline of a source row, such that data values in columns corresponding to the selected wordlines are not copied from the source row to the destination row.

8. The field-programmable crossbar array of claim 1 wherein the at least one interface circuit performs neuromorphic computing through vector multiplication between an input vector and a weight vector, where n columns in a given array of resistive devices store n bit weights therein.

9. A field-programmable crossbar array for reconfigurable computing, comprising:
    a plurality of crossbar modules interconnected together, each crossbar module is comprised of at least one interface circuit and an array of resistive memory devices arranged in columns and rows, such that resistive memory devices in each row of the array are interconnected by a respective bitline and resistive memory devices in each column of the array are interconnected by a respective wordline;
    wherein each resistive memory device in the array of resistive memory devices has an associated threshold voltage and is configured to store a data value therein as a resistance value;
    wherein the at least one interface circuit is electrically connected to each bitline in the array of resistive memory devices and is electrically connected to each wordline in the array of resistive memory devices, wherein the at least one interface circuit is configured to copy data values stored in a given crossbar module between rows or columns of the array of resistive memory devices in the given crossbar module without reading the data values out of the array of resistive memory devices and the at least one interface circuit cooperatively operates with the array of resistive memory devices to perform an arithmetic operation on data values stored in the array of resistive memory devices.

10. The field-programmable crossbar array of claim 9 wherein each resistive memory device in the array of resistive memory devices is configured to exhibit a high resistive state and a low resistive state, where the high resistive state represents a zero and the low resistive state represents a one.

11. The field-programmable crossbar array of claim 10 wherein the at least one interface circuit performs an addition operation by applying a voltage to each bitline in the array of resistive memory devices and measures output current on one or more of the wordlines in the array of resistive memory devices, such that magnitude of the output current on a given wordline indicates a number of ones stored by the resistive memory devices in the respective column.

12. The field-programmable crossbar array of claim 9 wherein the at least one interface circuit copies data values between rows of the array of resistive memory devices by resetting resistive memory devices in a destination row to a high resistive state and subsequently applying a write voltage between the bitline of the destination row and the bitline of the source row, where the write voltage is greater than the threshold voltage of the resistive memory devices.

13. The field-programmable crossbar array of claim 9 wherein the at least one interface circuit copies data values between rows of the array of resistive memory devices further comprises applying a bias voltage to select wordlines in the array of resistive memory devices while applying a write voltage between the bitline of the destination row and the bitline of a source row, such that data values in columns corresponding to the selected wordlines are not copied from the source row to the destination row.

14. A field-programmable crossbar array for reconfigurable computing, comprising:
a plurality of crossbar modules interconnected together, each crossbar module is comprised of at least one interface circuit and an array of resistive memory devices arranged in columns and rows, such that resistive memory devices in each row of the array are interconnected by a respective bitline and resistive memory devices in each column of the array are interconnected by a respective wordline;
wherein each resistive memory device in the array of resistive memory devices has an associated threshold voltage and is configured to store a data value therein as a resistance value;
wherein the at least one interface circuit is electrically connected to each bitline in the array of resistive memory devices and is electrically connected to each wordline in the array of resistive memory devices, wherein the at least one interface circuit cooperatively operates with the array of resistive memory devices to perform an arithmetic operation on data values stored in the array of resistive memory devices and to perform neuromorphic computing in the array of resistive memory devices; and
wherein the at least one interface circuit performs an addition operation by applying a voltage to selected bitlines in the array of resistive memory devices and measures output current on one or more of the wordlines in the array of resistive memory devices, such that magnitude of the output current on a given wordline indicates a number of ones stored by the resistive memory devices in the respective column at the selected rows.

15. The field-programmable crossbar array of claim 14 the at least one interface circuit performs neuromorphic computing through vector multiplication between an input vector and a weight vector, where n columns in a given array of resistive devices store n bit weights therein.

16. The field-programmable crossbar array of claim 14 wherein each resistive memory device in the array of resistive memory devices is configured to exhibit a high resistive state and a low resistive state, where the high resistive state represents a zero and the low resistive state represents a one.

* * * * *